US011145748B2

(12) United States Patent
Ching et al.

(10) Patent No.: US 11,145,748 B2
(45) Date of Patent: Oct. 12, 2021

(54) SEMICONDUCTOR ARRANGEMENT WITH SUBSTRATE ISOLATION

(71) Applicant: Taiwan Semiconductor Manufacturing Company Limited, Hsin-Chu (TW)

(72) Inventors: Kuo-Cheng Ching, Hsinchu County (TW); Ching-Wei Tsai, Hsinchu (TW); Chih-Hao Wang, Hsinchu County (TW); Carlos H. Diaz, Mountain View, CA (US)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 315 days.

(21) Appl. No.: 15/953,920

(22) Filed: Apr. 16, 2018

(65) Prior Publication Data

US 2018/0233586 A1 Aug. 16, 2018

Related U.S. Application Data

(63) Continuation of application No. 14/326,746, filed on Jul. 9, 2014, now Pat. No. 9,947,773, which is a continuation-in-part of application No. 13/594,190, filed on Aug. 24, 2012, now Pat. No. 9,006,829.

(51) Int. Cl.
| | |
|---|---|
| *H01L 29/66* | (2006.01) |
| *H01L 29/78* | (2006.01) |
| *H01L 29/423* | (2006.01) |
| *H01L 29/786* | (2006.01) |
| *H01L 29/165* | (2006.01) |

(52) U.S. Cl.
CPC .. *H01L 29/66795* (2013.01); *H01L 29/42392* (2013.01); *H01L 29/66772* (2013.01); *H01L 29/785* (2013.01); *H01L 29/78696* (2013.01); *H01L 29/165* (2013.01)

(58) Field of Classification Search
None
See application file for complete search history.

(56) References Cited

U.S. PATENT DOCUMENTS

| | | | |
|---|---|---|---|
| 6,365,465 B1 * | 4/2002 | Chan | H01L 29/42384 438/283 |
| 6,800,910 B2 | 10/2004 | Lin et al. | |
| 6,921,700 B2 | 7/2005 | Orlowski et al. | |

(Continued)

FOREIGN PATENT DOCUMENTS

WO WO2013154574 10/2013

*Primary Examiner* — Nilufa Rahim
(74) *Attorney, Agent, or Firm* — Haynes and Boone, LLP

(57) ABSTRACT

One or more semiconductor arrangements and techniques for forming such semiconductor arrangements are provided. A semiconductor arrangement comprises a channel, such as an un-doped channel, over a substrate. The semiconductor arrangement comprises a gate, such as a gate-all-around structure gate, around the channel. The semiconductor arrangement comprises an isolation structure, such as a silicon germanium oxide structure, between the gate and the substrate. The isolation structure blocks current leakage into the substrate. Because the semiconductor arrangement comprises the isolation structure, the channel can be left un-doped, which improves electron mobility and decreases gate capacitance.

20 Claims, 17 Drawing Sheets

(56) References Cited

U.S. PATENT DOCUMENTS

| | | | |
|---|---|---|---|
| 7,309,635 | B2 | 12/2007 | Park et al. |
| 7,316,979 | B2 | 1/2008 | Liaw |
| 8,241,971 | B2 | 8/2012 | Bangsaruntip et al. |
| 8,273,617 | B2 | 9/2012 | Thompson et al. |
| 9,006,829 | B2 | 4/2015 | Colinge et al. |
| 9,123,790 | B2 | 9/2015 | Pillarisetty et al. |
| 9,129,827 | B2 * | 9/2015 | Cappellani et al. |
| 2011/0133169 | A1 * | 6/2011 | Bangsaruntip ...... H01L 29/0673 257/38 |
| 2012/0007051 | A1 * | 1/2012 | Bangsaruntip ........ H01L 29/775 257/24 |
| 2014/0183633 | A1 * | 7/2014 | Chen ....................... H01L 29/20 257/347 |

* cited by examiner

SEMICONDUCTOR ARRANGEMENT WITH SUBSTRATE ISOLATION

CROSS-REFERENCE

This application is a continuation application of U.S. patent application Ser. No. 14/326,746 filed Jul. 9, 2014, issuing as U.S. Pat. No. 9,947,773, which is a continuation in part of U.S. patent application Ser. No. 13/594,190, filed Aug. 24, 2012, now U.S. Pat. No. 9,006,829, the entire disclosures are incorporated herein by reference.

RELATED APPLICATION(S)

This application is a continuation in-part of U.S. patent application Ser. No. 13/594,190, filed on Aug. 24, 2012, entitled "Aligned Gate-All-Around Structure," which is hereby incorporated by reference.

BACKGROUND

A transistor, such as a FinFET transistor, comprises a source, a drain, and a channel between the source and the drain. The transistor comprises a gate proximate the channel such that flow of current through the channel is controlled by voltage applied to the gate. The transistor is generally regarded as being in an "on" state when current is flowing through the channel, and in an "off" state when little to no current is flowing through the channel.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
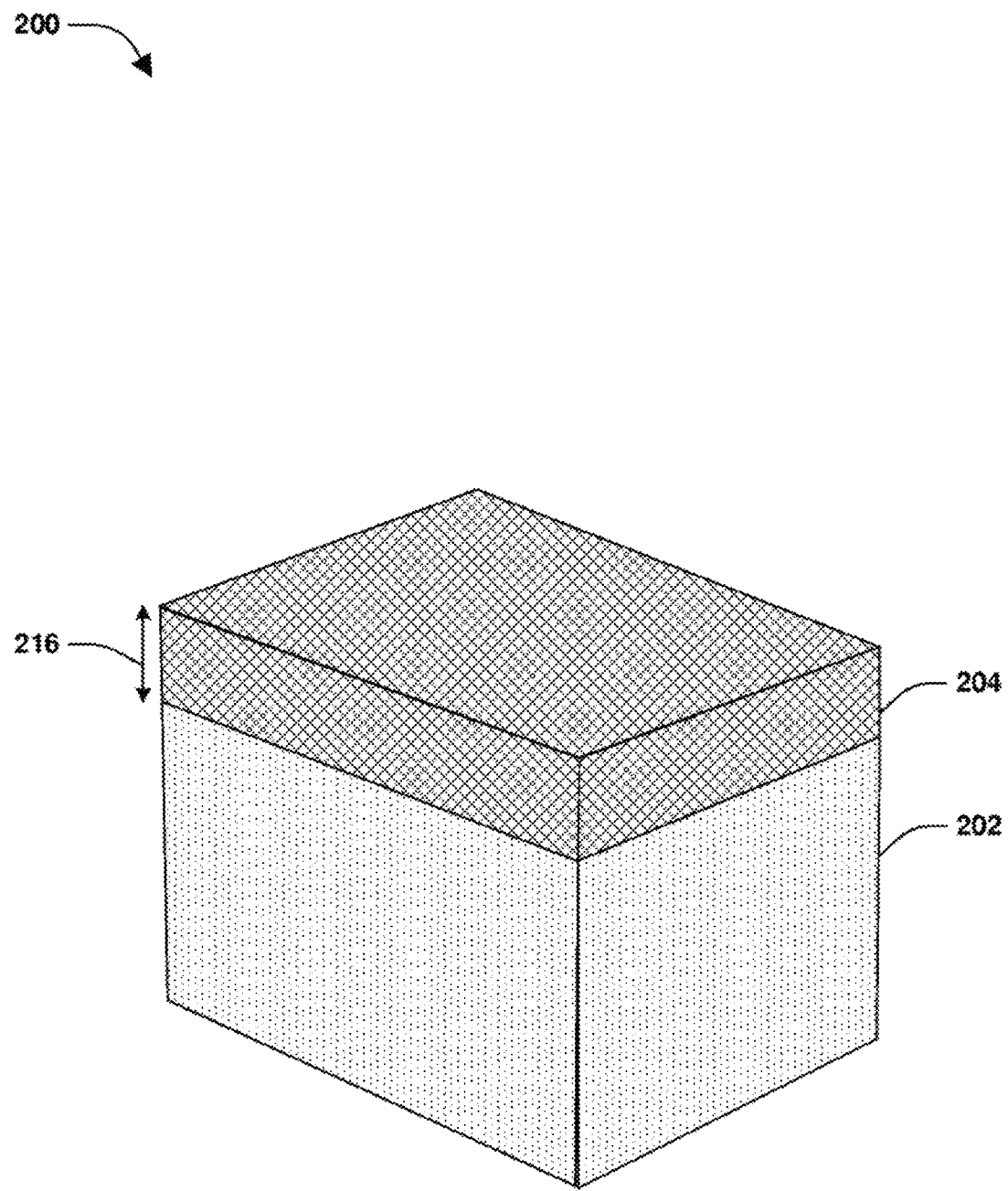
FIG. 1 is an illustration of a semiconductor arrangement comprising a first silicon layer formed over a substrate, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly As provided herein, an isolation structure is formed over a substrate upon which a semiconductor arrangement is formed. According to some embodiments, the semiconductor arrangement comprises one or more fin type field effect transistors (FinFETs). According to some embodiments, the isolation structure is formed between a gate of the semiconductor arrangement and the substrate, and between a channel of the semiconductor arrangement and the substrate. The isolation structure blocks current leakage into the substrate, such as currant leakage from the channel or other portions of the semiconductor arrangement into the substrate. In some embodiments, the isolation structure comprises silicon germanium oxide. Because the isolation structure blocks current leakage, an anti-punch through (APT) implant process is not performed, according to some embodiments, and thus the channel comprises few to no dopants and is regarded as un-doped. In some embodiments, where dopants are not introduced into the channel, the un-doped channel provides increased electron mobility and the semiconductor arrangement exhibits reduced gate capacitance.

Formation of a semiconductor arrangement 200, comprising one or more isolation structures that block current leakage into a substrate 202, is illustrated in FIGS. 1-16b. FIG. 1 illustrates a first silicon layer such as a first silicon germanium layer 204 formed over the substrate 202. One or more layers other than the silicon germanium layer 204 for the silicon layer are within the scope of various embodiments. In some embodiments, the substrate 202 includes at least one of an epitaxial layer, a silicon-on-insulator (SOI) structure, a wafer, or a die formed from a wafer. In some embodiments, the substrate 202 comprises at least one of silicon, carbon, etc. In some embodiments, the first silicon germanium layer 204 has a thickness 216 between about 3 nm and about 15 nm.

Figure 2:
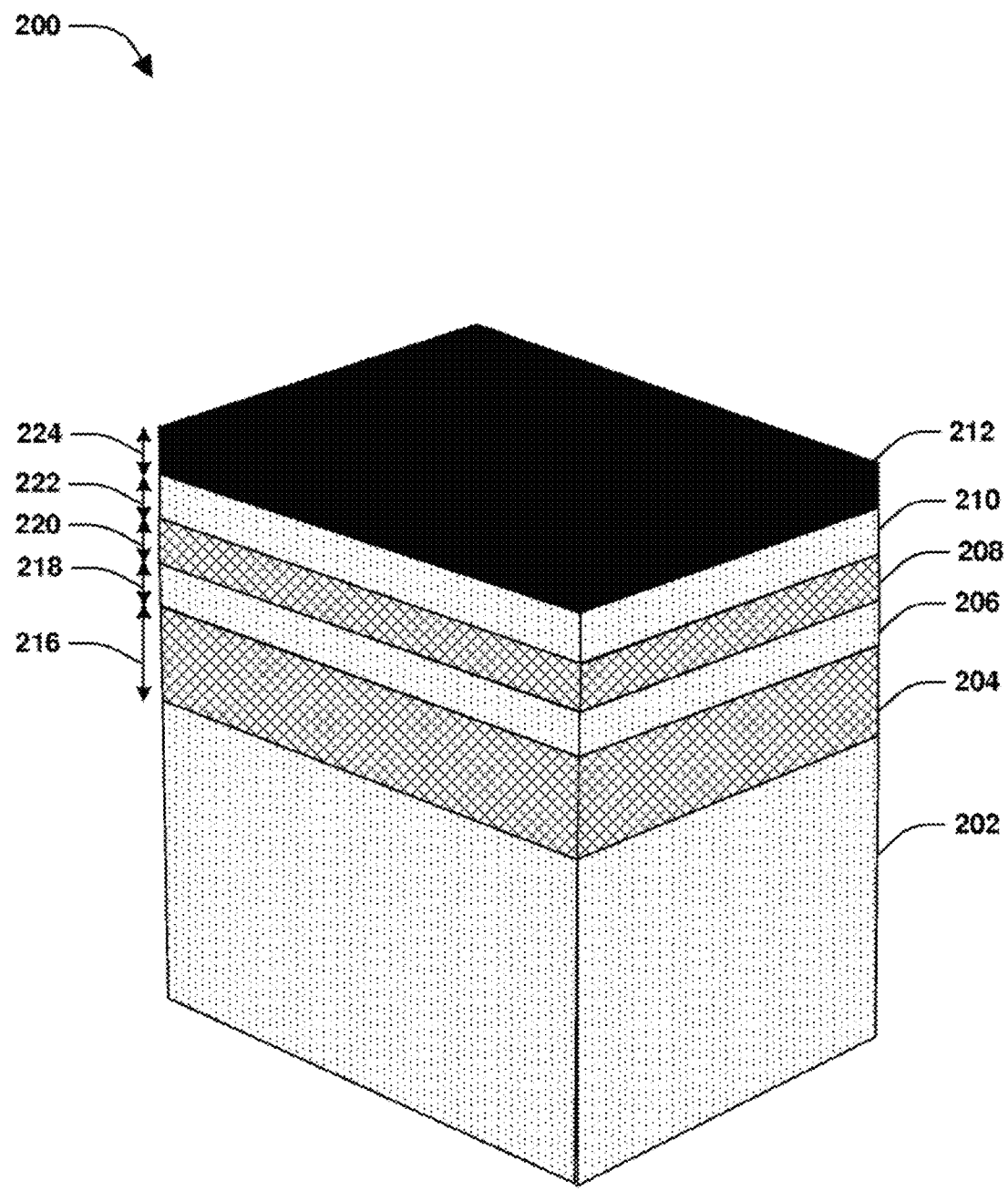
FIG. 2 is an illustration of a semiconductor arrangement comprising a first silicon layer, a first channel layer, a second silicon layer, and a second channel layer formed over a substrate, in accordance with some embodiments.

FIG. 2 illustrates a first channel layer 206 formed over the first silicon germanium layer 204, where one or more channels such as a first channel are subsequently formed from the first channel layer 206. In some embodiments, the first channel layer 206 comprises silicon or other suitable channel material. In some embodiments, the first channel layer 206 has a thickness 218 between about 8 nm and about 15 nm, such as about 10 nm. A second silicon layer such as a second silicon germanium layer 208 is formed over the first channel layer 206. One or more layers other than the second silicon germanium layer 208 for the second silicon layer are within the scope of various embodiments. In some embodiments, the second silicon germanium layer 208 has a thickness 220 between about 3 nm and about 15 nm. A second channel layer 210 is formed over the second silicon germanium layer 208, where one or more channels such as a second channel are subsequently formed from the second channel layer 210. In some embodiments, the second channel layer 210 comprises silicon or other suitable channel material. In some embodiments, the second channel layer 210 has a thickness 222 between about 8 nm and about 15 nm, such as about 10 nm. A hard mask 212 is formed over the second channel layer 210. In some embodiments, the hard mask 212 has a thickness 224 between about 5 nm and about 15 nm, such as about 10 nm.

Figure 3:
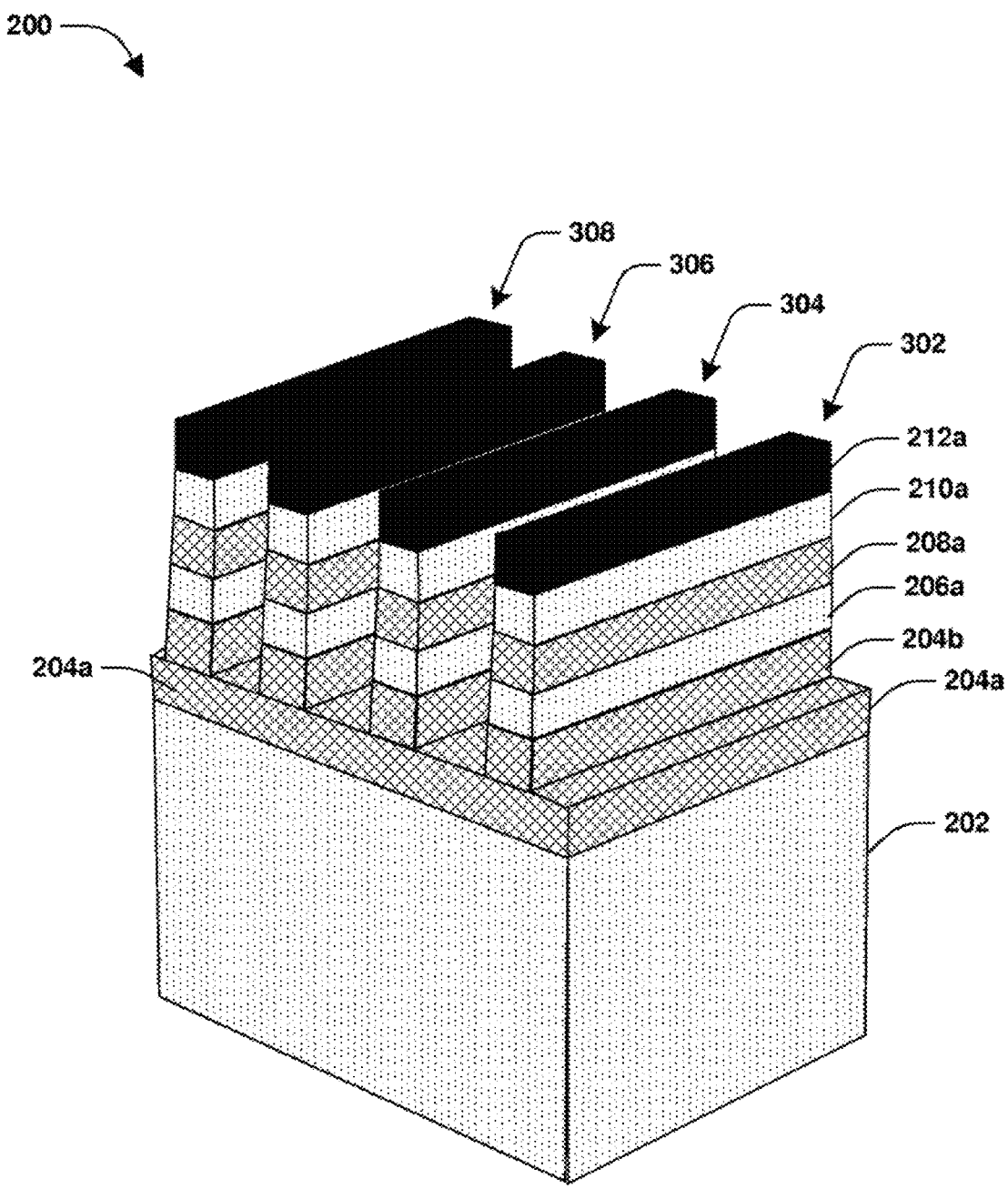
FIG. 3 is an illustration of a fin formation process for a semiconductor arrangement, in accordance with some embodiments.

FIG. 3 illustrates a fin formation process to form at least one of a first fin region 302, a second fin region 304, a third fin region 306, a fourth fin region 308, or other fin regions not illustrated. Other than four fin regions are contemplated and are within the scope of various embodiments. In some embodiments, an etching process, such as a dry etch, is used to etch through at least some of the hard mask 212, at least some of the second channel layer 210, at least some of the second silicon germanium layer 208, at least some of the first channel layer 206, and at least some of the first silicon germanium layer 204. In some embodiments, the first fin region 302 comprises a hard mask portion 212a, a second channel 210a, a second silicon germanium layer portion 208a, a first channel 206a, a first silicon germanium layer portion 204b, and at least a portion of an etched first silicon germanium layer portion 204a overlaying the substrate 202. In some embodiments, the first fin region 302, the second fin region 304, the third fin region 306, and the fourth fin region 308 are formed over the etched first silicon germanium layer portion 204a that comprises at least a portion of the first silicon germanium layer 204 not removed by the fin formation process.

Figure 4:
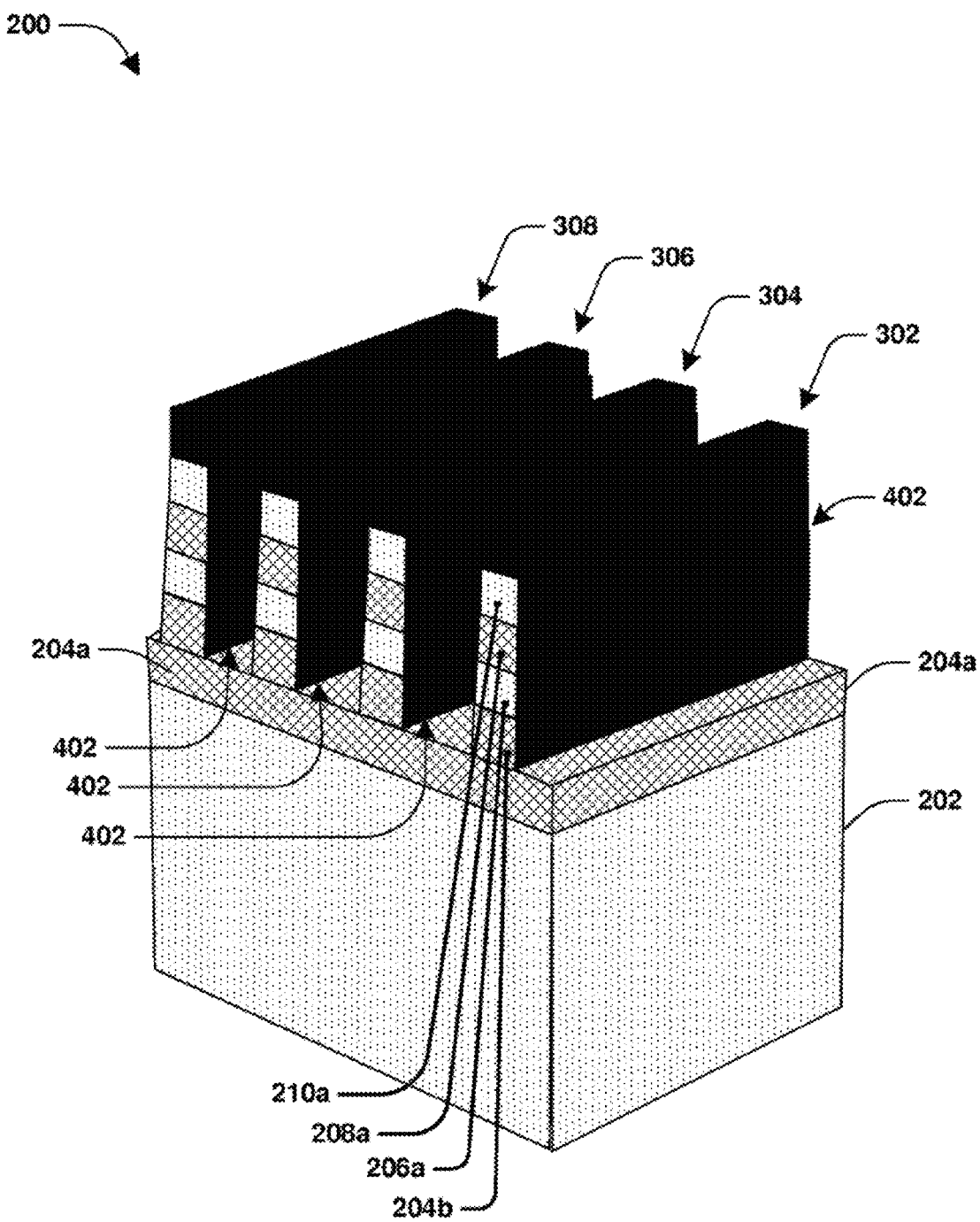
FIG. 4 is an illustration of forming a liner for a semiconductor arrangement, in accordance with some embodiments.

FIG. 4 illustrates forming a liner 402 over the first fin region 302, the second fin region 304, the third fin region 306, and the fourth fin region 308. In some embodiments, the liner 402 comprises silicon nitride. In some embodiments, the liner 402 is formed by depositing a liner layer over the semiconductor arrangement 200, and etching a portion of the liner layer that is over at least some of a top surface of the etched first silicon germanium layer portion 204a. In some embodiments, the liner 402 protects at least one of the second silicon germanium layer portion 208a or the first silicon germanium layer portion 204b during a subsequent etch.

Figure 5:
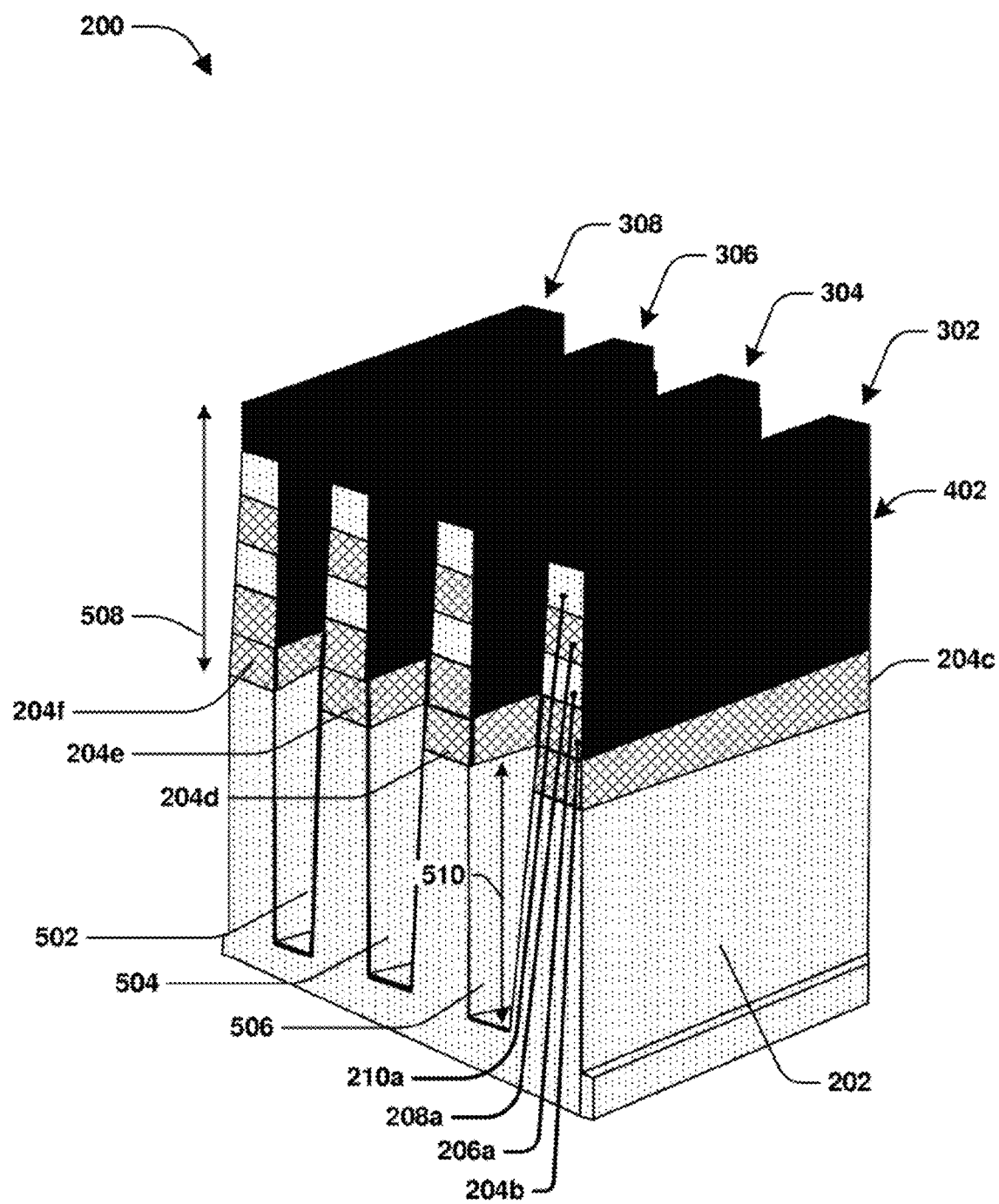
FIG. 5 is an illustration of forming one or more fin trenches for a semiconductor arrangement, in accordance with some embodiments.

FIG. 5 illustrates forming a first fin trench 502, a second fin trench 504, and a third fin trench 506. The first fin trench 502 is formed between the fourth fin region 308 and the third fin region 306. The second fin trench 504 is formed between the third fin region 306 and the second fin region 304. The third fin trench 506 is formed between the second fin region 304 and the first fin region 302. In some embodiments, the fin trenches are formed by an etching process the removes a portion of the etched first silicon germanium layer portion 204a, resulting in a first silicon germanium structure 204c for the first fin region 302, a second silicon germanium structure 204d for the second fin region 304, a third silicon germanium structure 204e for the third fin region 306, and a fourth silicon germanium structure 204f for the fourth fin region 308. In some embodiments, the etching process removes a portion of the substrate 202 to form the fin trenches. In some embodiments, a fin region has a height 508 between about 50 nm and about 70 nm. In some embodiments, a fin trench, such as the third fin trench 506, has a depth 510 between about 50 nm and about 70 nm. The fin trenches provide isolation between devices of the semiconductor arrangement 200.

Figure 6:
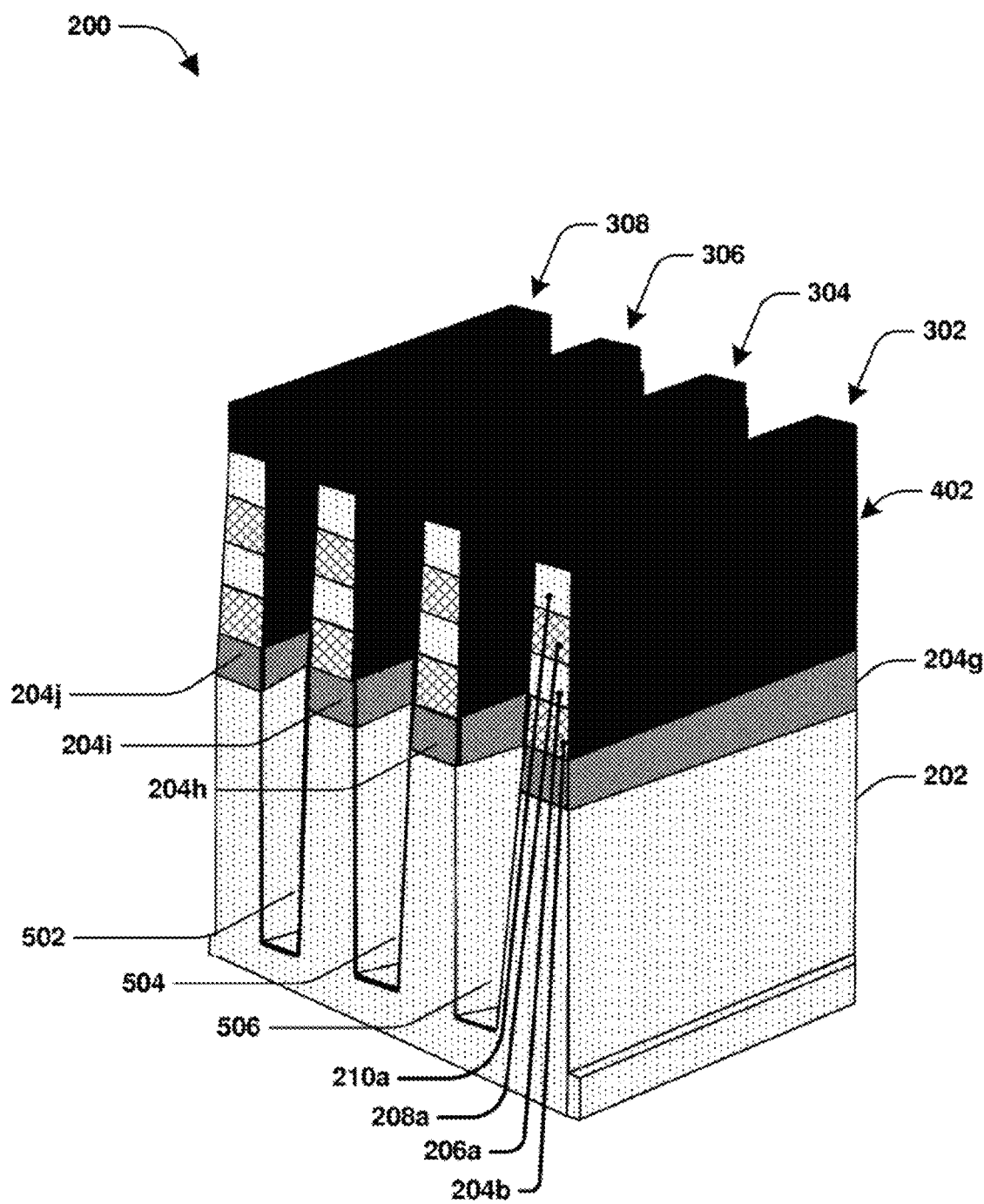
FIG. 6 is an illustration of forming one or more isolation structures or isolation fin structures for a semiconductor arrangement, in accordance with some embodiments.

FIG. 6 illustrates forming a first isolation structure 204g, a second fin isolation structure 204h, a third fin isolation structure 204i, and a fourth fin isolation structure 204j. In some embodiments, an oxidation process is used to oxidize the first silicon germanium structure 204c to create the first isolation structure 204g for the first fin region 302, the second silicon germanium structure 204d to create the second fin isolation structure 204h for the second fin region 304, the third silicon germanium structure 204e to create the third fin isolation structure 204i for the third fin region 306, and the fourth silicon germanium structure 204f to create the fourth fin isolation structure 204j for the fourth fin region 308. In some embodiments, the first isolation structure 204g, the second fin isolation structure 204h, the third fin isolation structure 204i, and the fourth fin isolation structure 204j comprise silicon germanium oxide.

Figure 7:
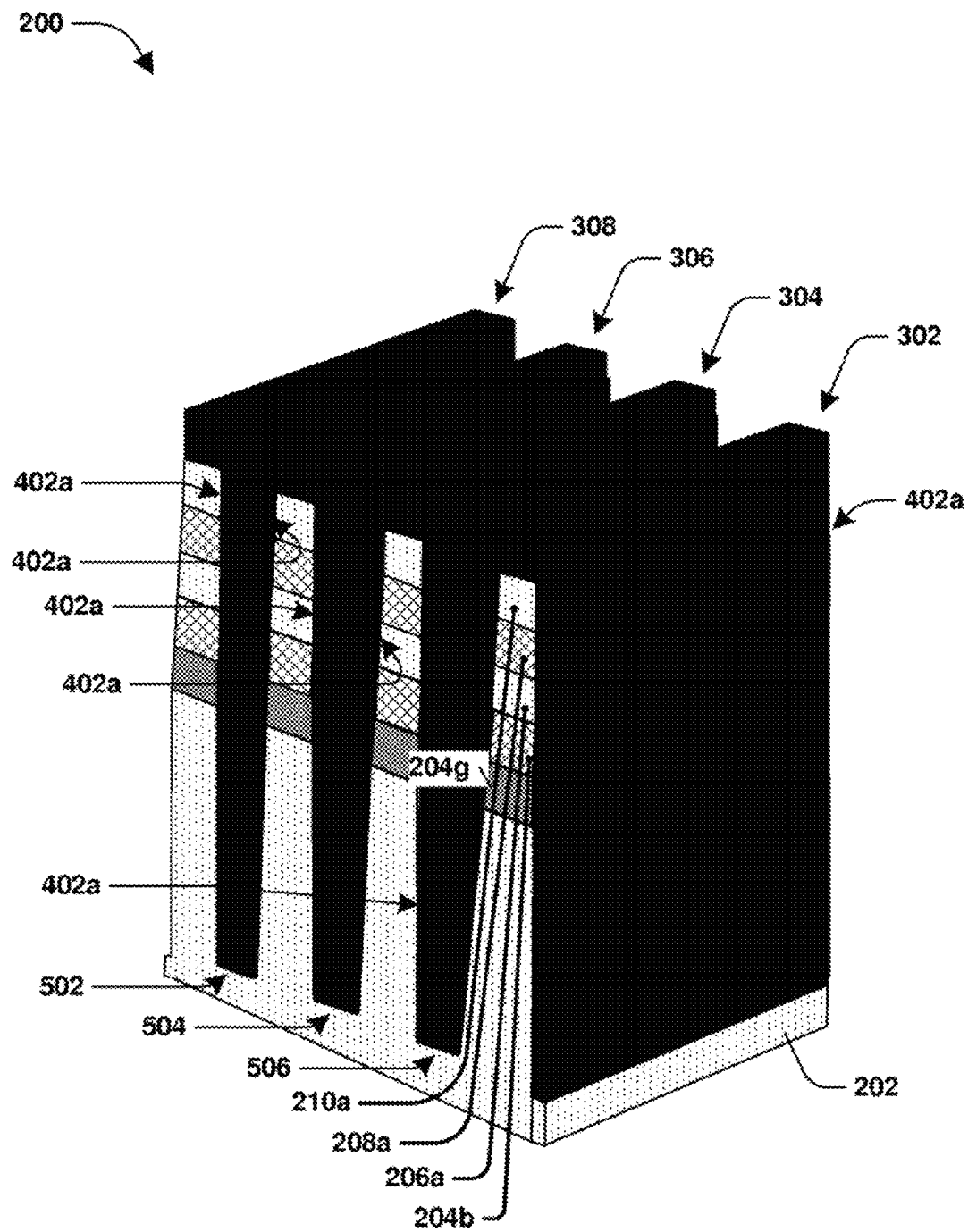
FIG. 7 is an illustration of creating a modified liner for a semiconductor arrangement, in accordance with some embodiments.

FIG. 7 illustrates creating a modified liner 402a from the liner 402. In some embodiments, a liner deposition process is performed to add liner material, such as silicon nitride, to the liner 402 to create the modified liner 402a. In some embodiments, the modified liner 402a lines sidewalls of the first fin region 302, the second fin region 304, the third fin region 306, and the fourth fin region 308. In some embodiments, the modified liner 402a lines sidewalls of the first fin trench 502, the second fin trench 504, and the third fin trench 506.

Figure 8:
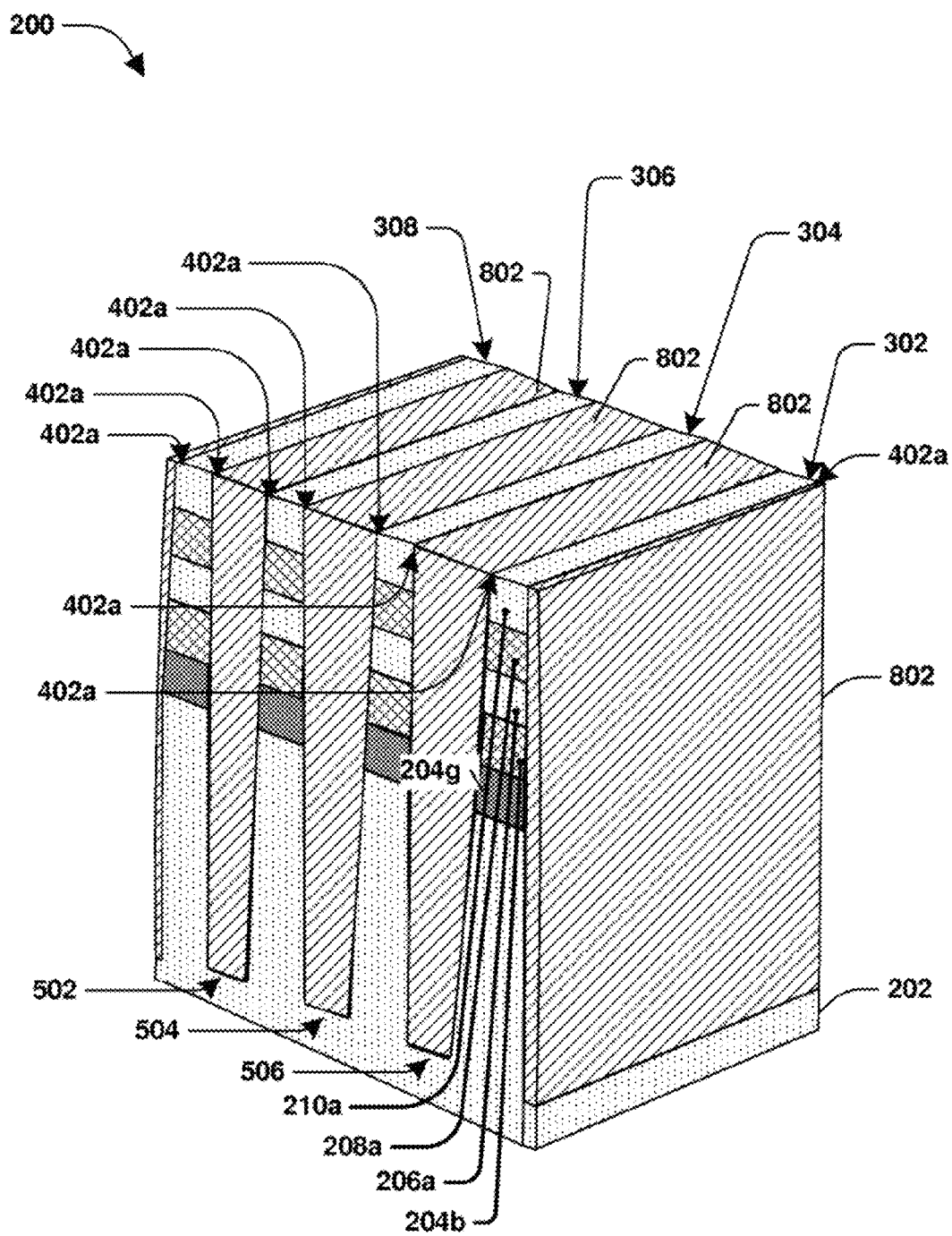
FIG. 8 is an illustration of forming a shallow trench isolation (STI) structure for a semiconductor arrangement, in accordance with some embodiments.

FIG. 8 illustrates forming a shallow trench isolation (STI) structure 802 between the first fin region 302, the second fin region 304, the third fin region 306, and the fourth fin region 308. In some embodiments, the STI structure 802 is formed along sidewalls of the first fin trench 502, the second fin trench 504, and the third fin trench 506. In some embodiments, the STI structure 802 is formed between the modified liner 402 lining sidewalls of the fin regions and the fin trenches, and thus the modified liner 402a is not visible in FIG. 8 because the modified liner 402a is covered by the STI structure 802. In some embodiments, a curing process is performed upon the STI structure 802. In some embodiments, a chemical mechanical polish (CMP) is performed to remove the hard mask 212, such as the first hard mask 212a, thereby revealing top surfaces of second channels, such as the second channel 210a, as well top surfaces of the STI structure 802.

Figure 9:
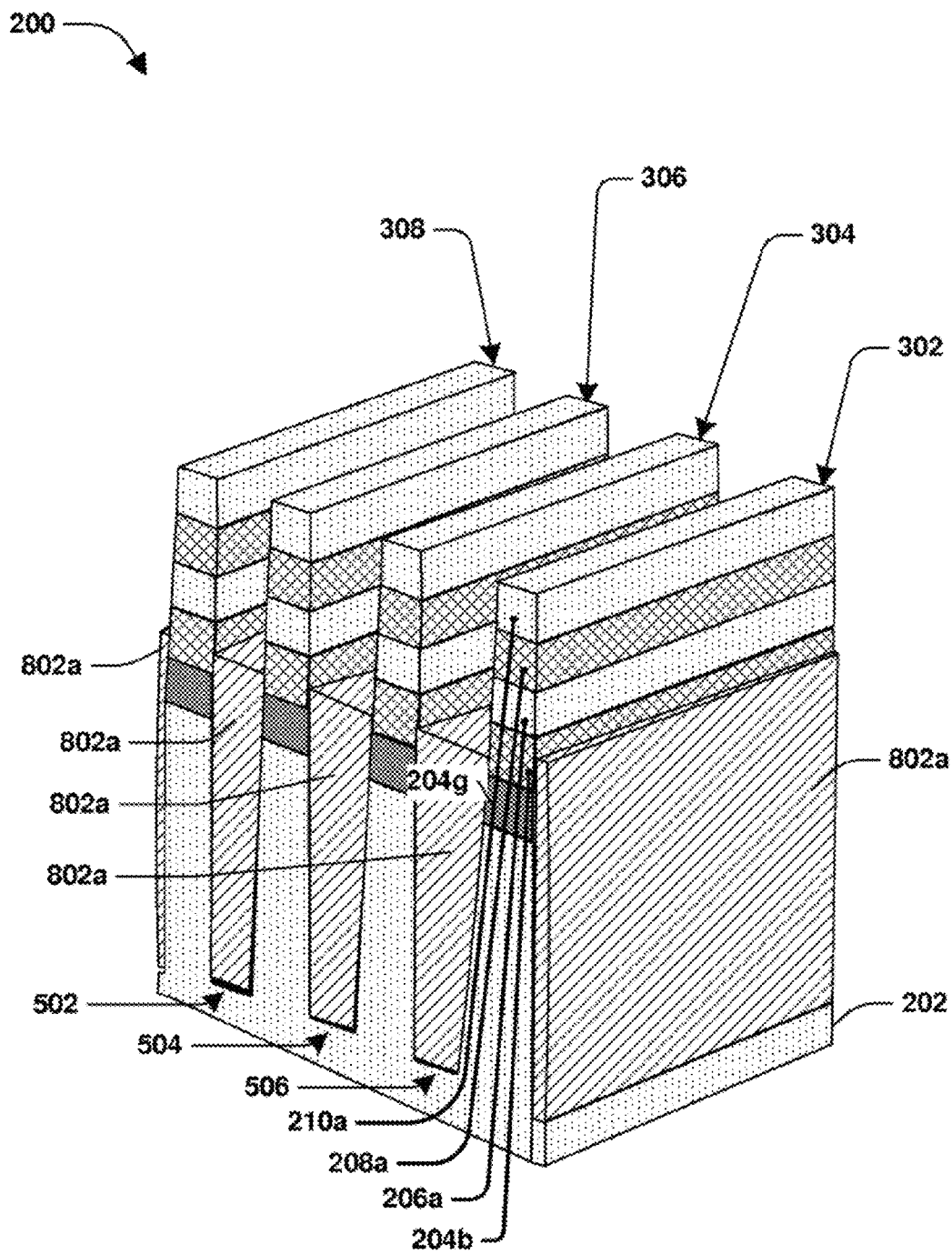
FIG. 9 is an illustration of creating a modified shallow trench isolation (STI) structure for a semiconductor arrangement, in accordance with some embodiments.

FIG. 9 illustrates creating a modified STI structure 802a from the STI structure 802. In some embodiments, an STI recess technique is performed to remove a portion of the STI structure 802 between the first fin region 302, the second fin region 304, the third fin region 306, and the fourth fin region 308 to create the modified STI structure 802a. In some embodiment, a fluorine gas is used to etch at least a portion of the STI structure 802, such as for removal of an oxide material. In some embodiments, a wet etch is performed to remove at least a portion of the modified liner 402a, such as for removal of a nitride material. According to some embodiments, when the portion of the STI structure 802 is removed to create the modified STI structure 802a, a corresponding portion of the modified liner 402a is removed as well, such that the first fin region 302, the second fin region 304, the third fin region 306, and the fourth fin region 308 are substantially exposed.

Figure 10A:
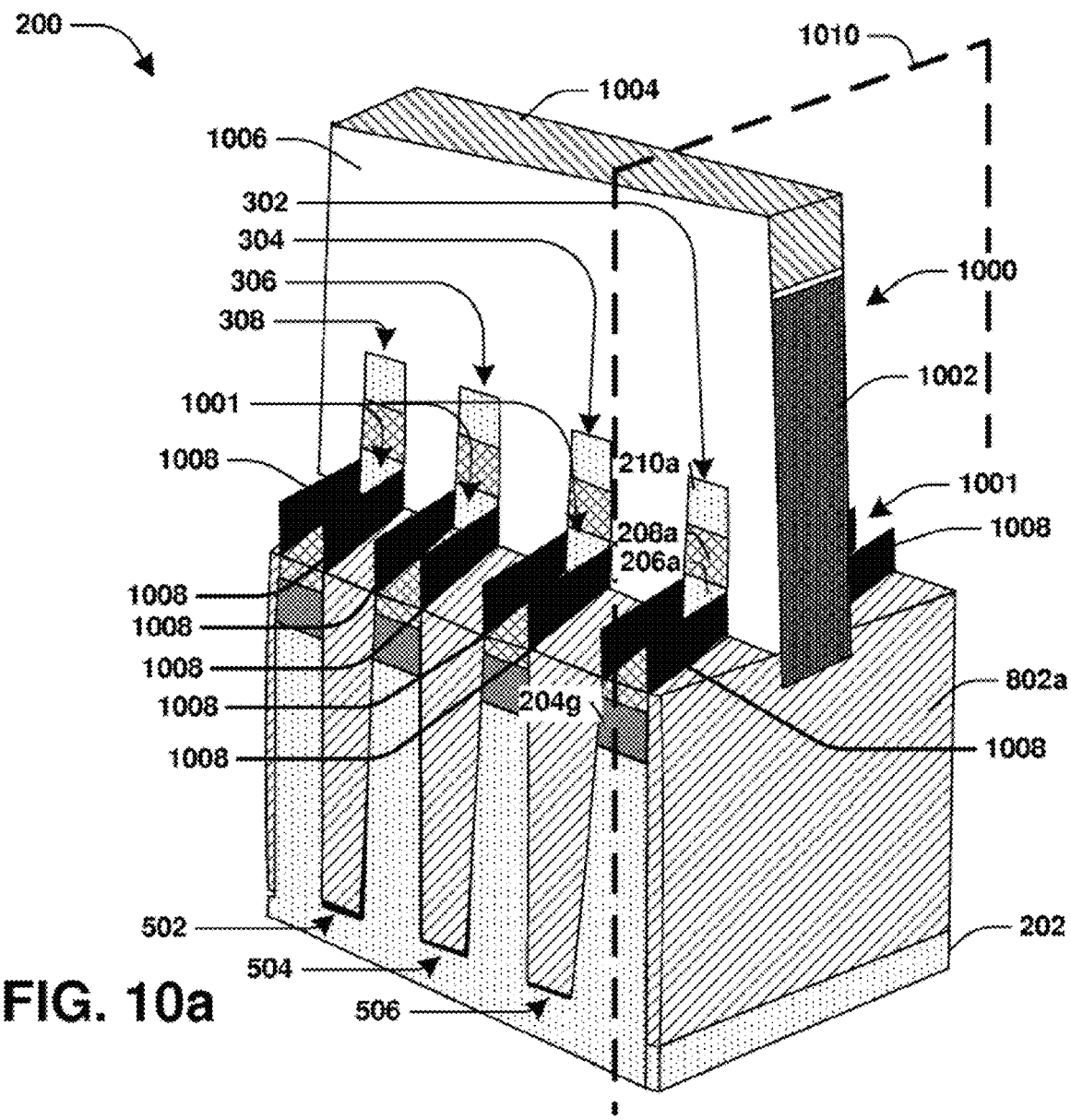
FIG. 10a is an illustration of forming a gate region structure and defining source and drain regions for a semiconductor arrangement, in accordance with some embodiments.
Figure 10B:
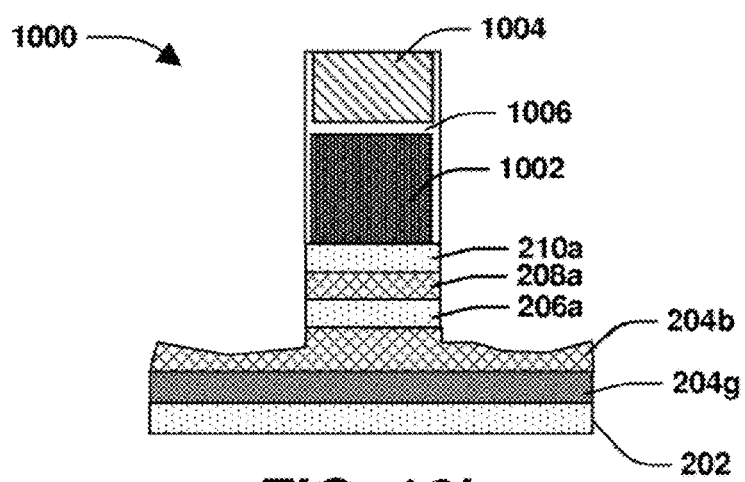
FIG. 10b is a cross sectional view of a portion of a semiconductor arrangement, in accordance with some embodiments.

FIG. 10a illustrates forming a gate region structure 1000 and defining source and drain regions 1001, and FIG. 10b illustrates a cross sectional view of a portion of the semiconductor arrangement 200 taken at a plane 1010. In some embodiments, a dummy poly structure 1002 is formed over and between middle portions of the first fin region 302, the second fin region 304, the third fin region 306, and the fourth fin region 308. In some embodiments, a second liner 1006, such as a nitride liner, is formed, such as deposited, on sidewalls of the dummy poly structure 1002. In some embodiments, sidewall structures 1008 are created by forming a layer, such as a nitride layer, over end portions of the first fin region 302, the second fin region 304, the third fin region 306, and the fourth fin region 308, and a source and drain recessing process is used to remove at least some of the layer, resulting in the sidewall structures 1008 that define source and drain regions 1001 within which sources and drains for the semiconductor arrangement 200 are to be formed. In some embodiments, a second layer 1004, comprising a material such as oxide, is formed over the dummy poly structure 1002, and the second liner 1006 is formed around the second layer 1004.

Figure 11A:
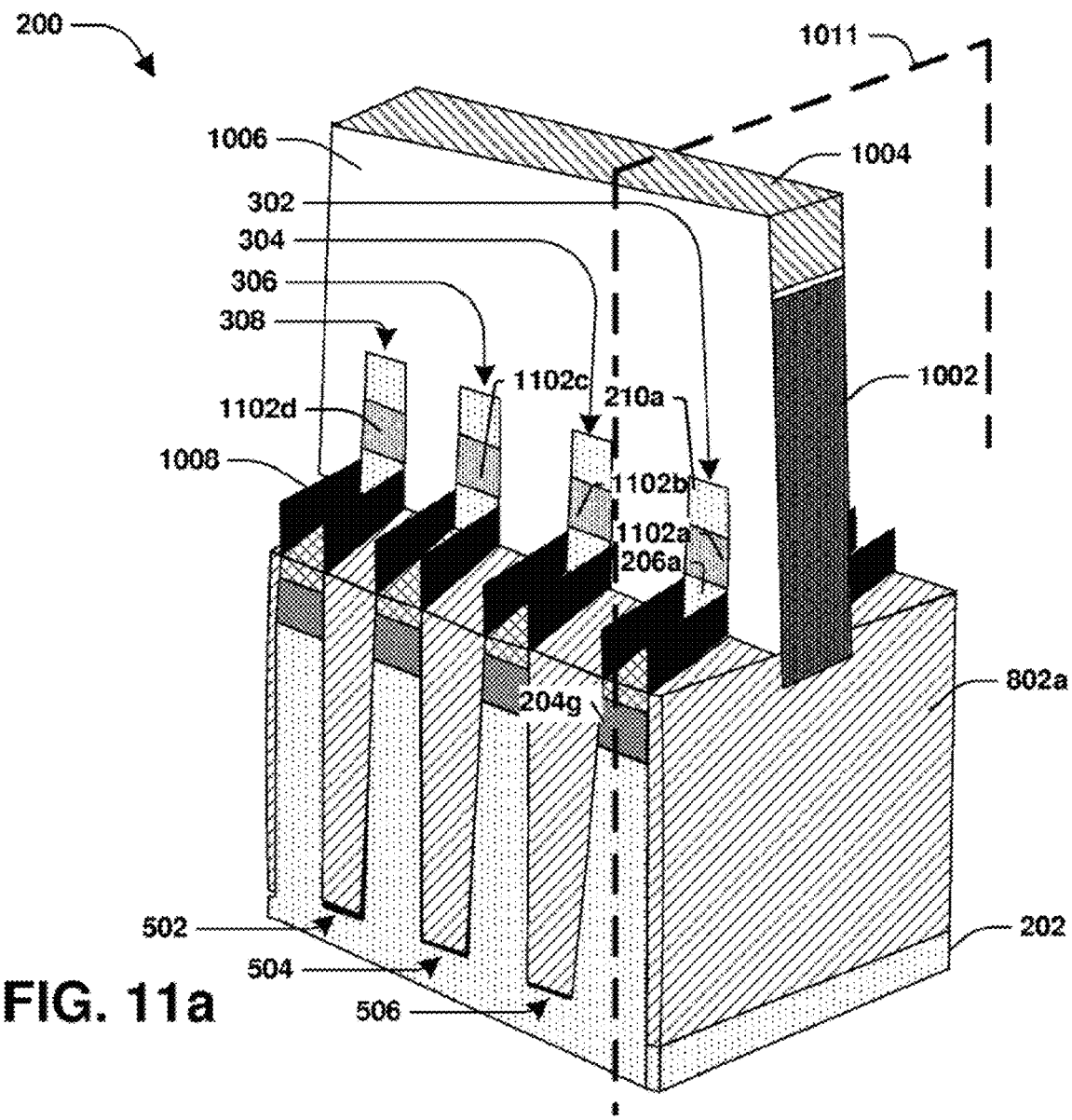
FIG. 11a is an illustration of forming one or more spacers for a semiconductor arrangement, in accordance with some embodiments.
Figure 11B:
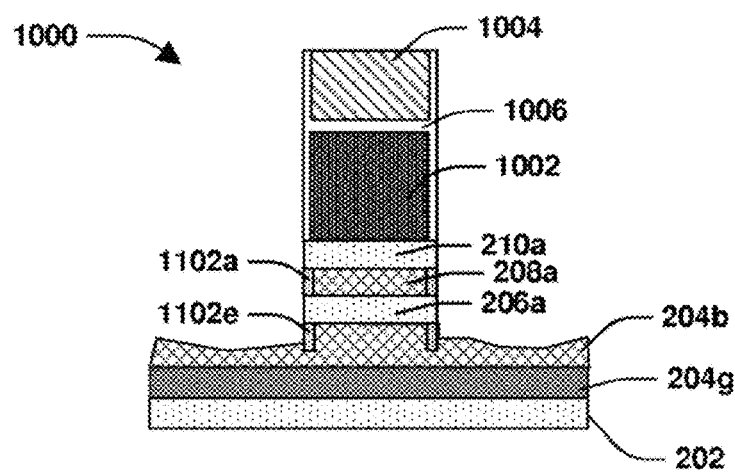
FIG. 11b is a cross sectional view of a portion of a semiconductor arrangement, in accordance with some embodiments.

FIG. 11a illustrates forming one or more spacers, such as a first spacer 1102a, a second spacer 1102b, a third spacer 1102c, a fourth spacer 1102d, a fifth spacer 1102e or other spacers not illustrated, and FIG. 11b illustrates a cross sectional view of a portion of the semiconductor arrangement 200 taken at a plane 1011. In some embodiments, a silicon germanium lateral etch is performed to remove a portion of the second silicon germanium layer portion 208a and a portion of the first silicon germanium layer portion 204b to define spacer regions within which the spacers are formed. Spacer material, such as silicon nitride, is formed, such as deposited, within the spacer regions to form the spacers.

Figure 12A:
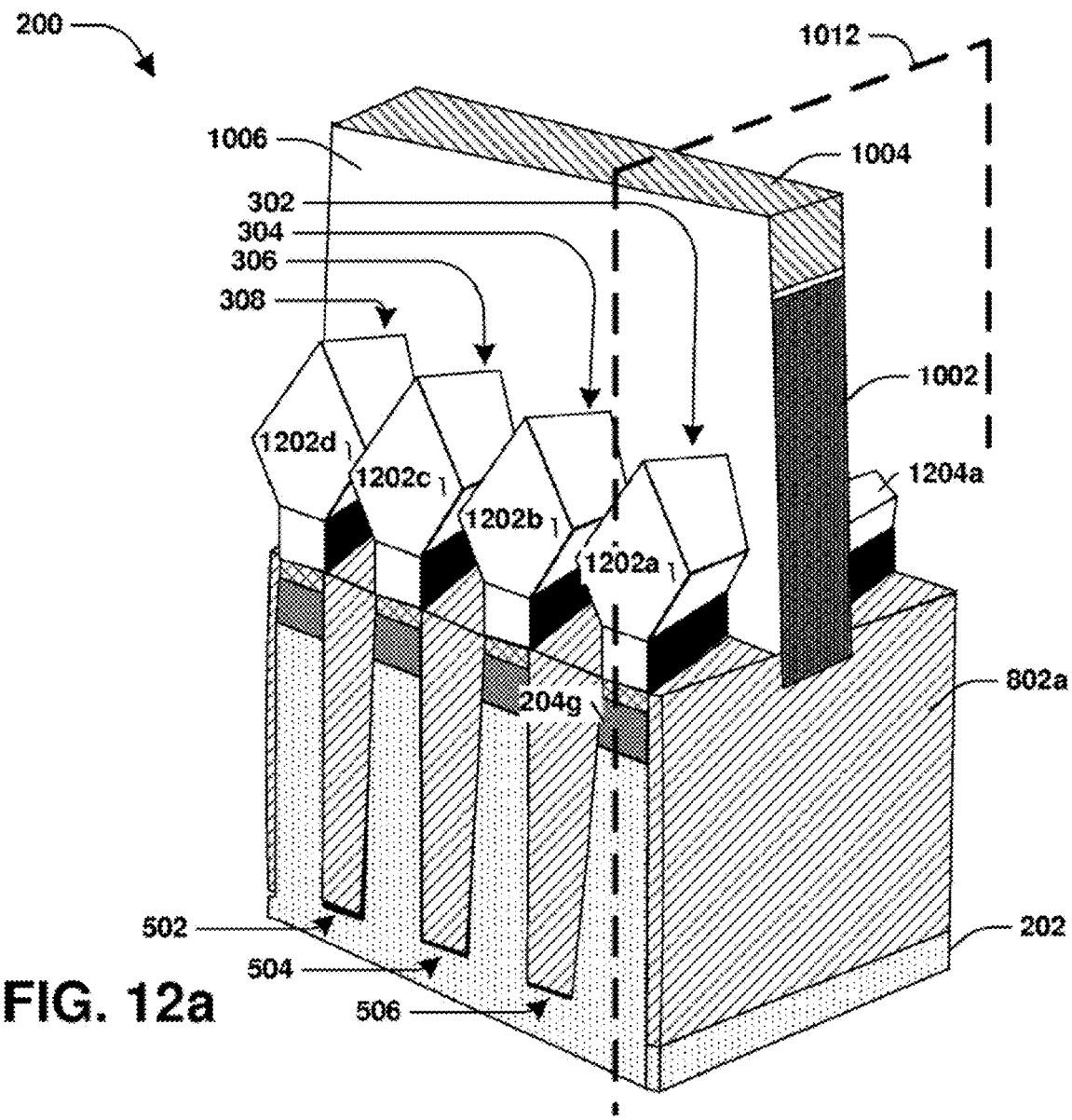
FIG. 12a is an illustration of forming sources and drains for a semiconductor arrangement, in accordance with some embodiments.
Figure 12B:
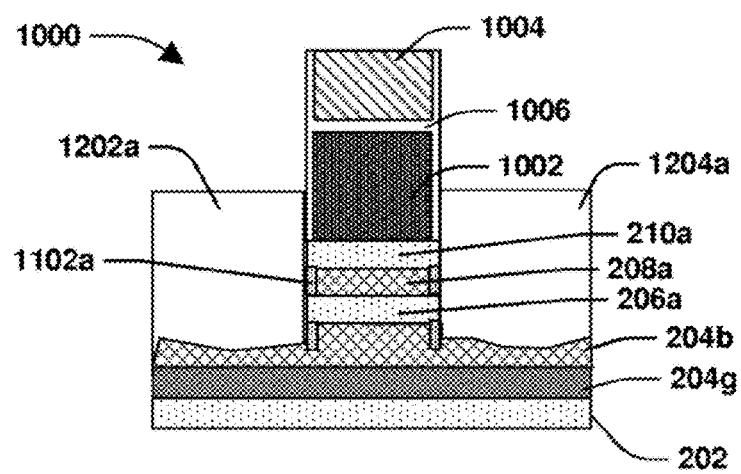
FIG. 12b is a cross sectional view of a portion of a semiconductor arrangement, in accordance with some embodiments.
Figure 16A:
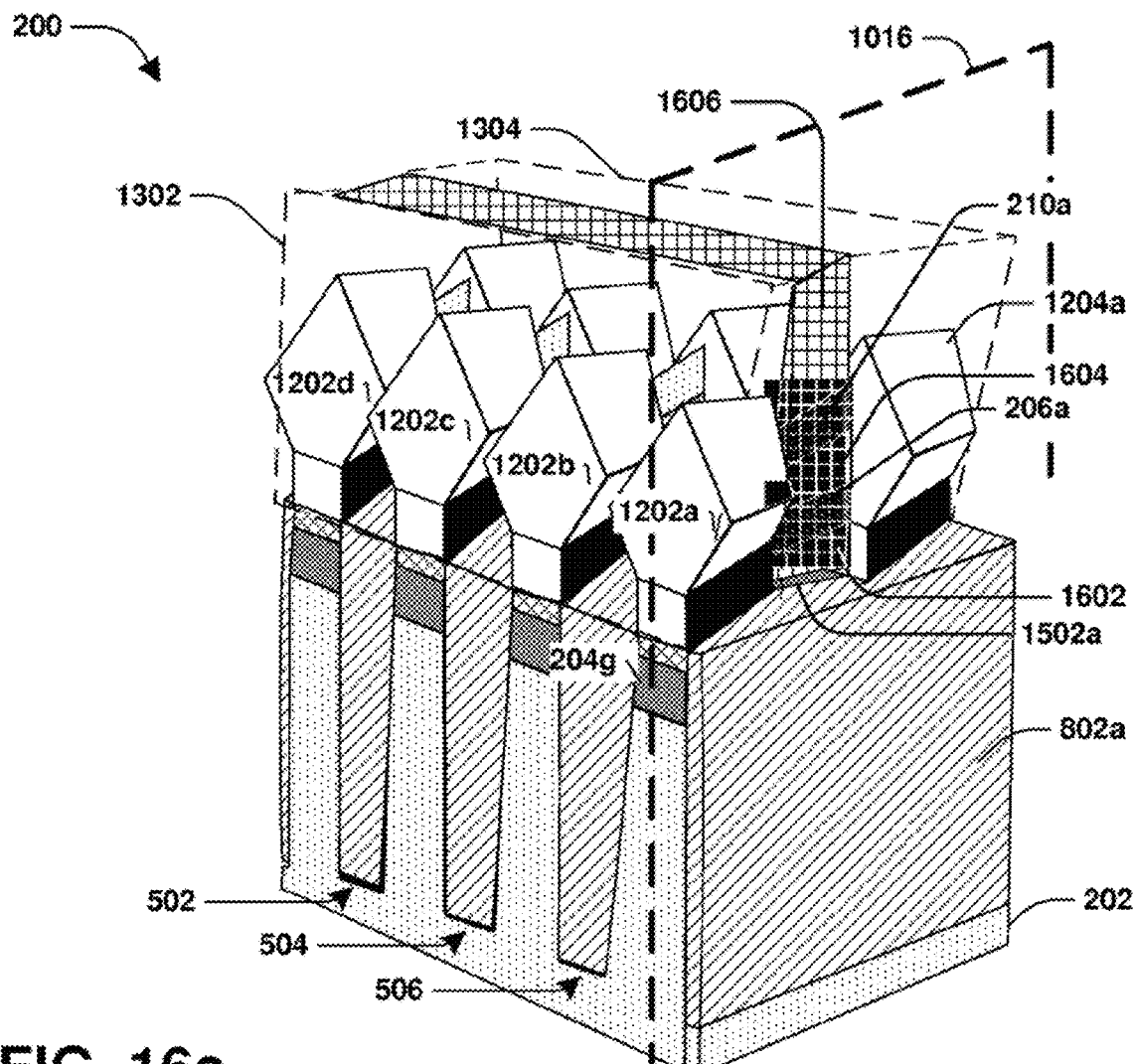
FIG. 16a is an illustration of forming a gate for a semiconductor arrangement, in accordance with some embodiments.
Figure 16B:
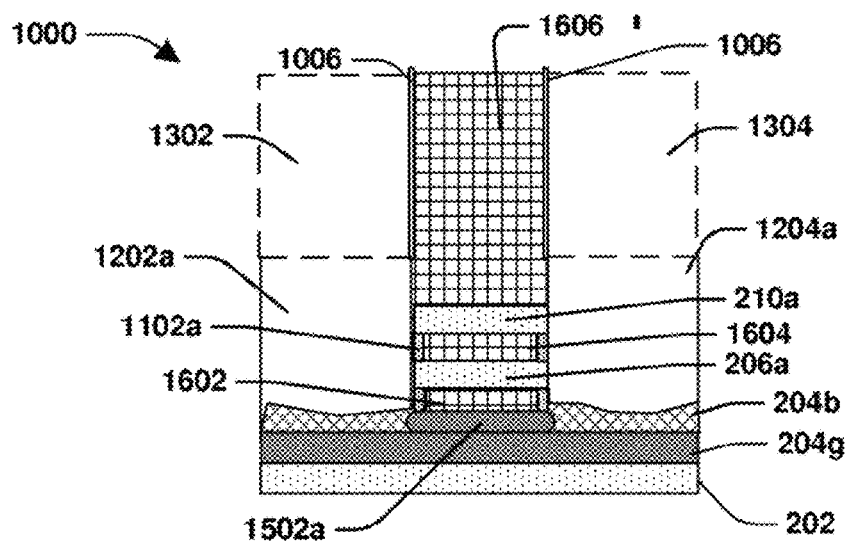
FIG. 16b is a cross sectional view of a portion of a semiconductor arrangement, in accordance with some embodiments.

FIG. 12a illustrates forming sources and drains within the source and drain regions 1001, and FIG. 12b illustrates a cross sectional view of a portion of the semiconductor arrangement 200 taken at a plane 1012. In some embodiments, a first source 1202a is formed on a first side of the first fin region 302 and a first drain 1204a is formed on a second side of the first fin region 302. One or more devices, such as transistors, are formed from the first source 1202a, the first drain 1204a, the first channel 206a, the second channel 210a, and a gate that is illustrated in FIGS. 16a and 16b. In some embodiments, an epitaxial growth process is performed within the source and drain regions 1001 between the sidewall structures 1008 to grow the sources and the drains, such as the first source 1202a, a second source 1202b, a third source 1202c, a fourth source 1202d, the first drain 1204a, or other sources and drains not illustrated.

Figures 13A, 13B:
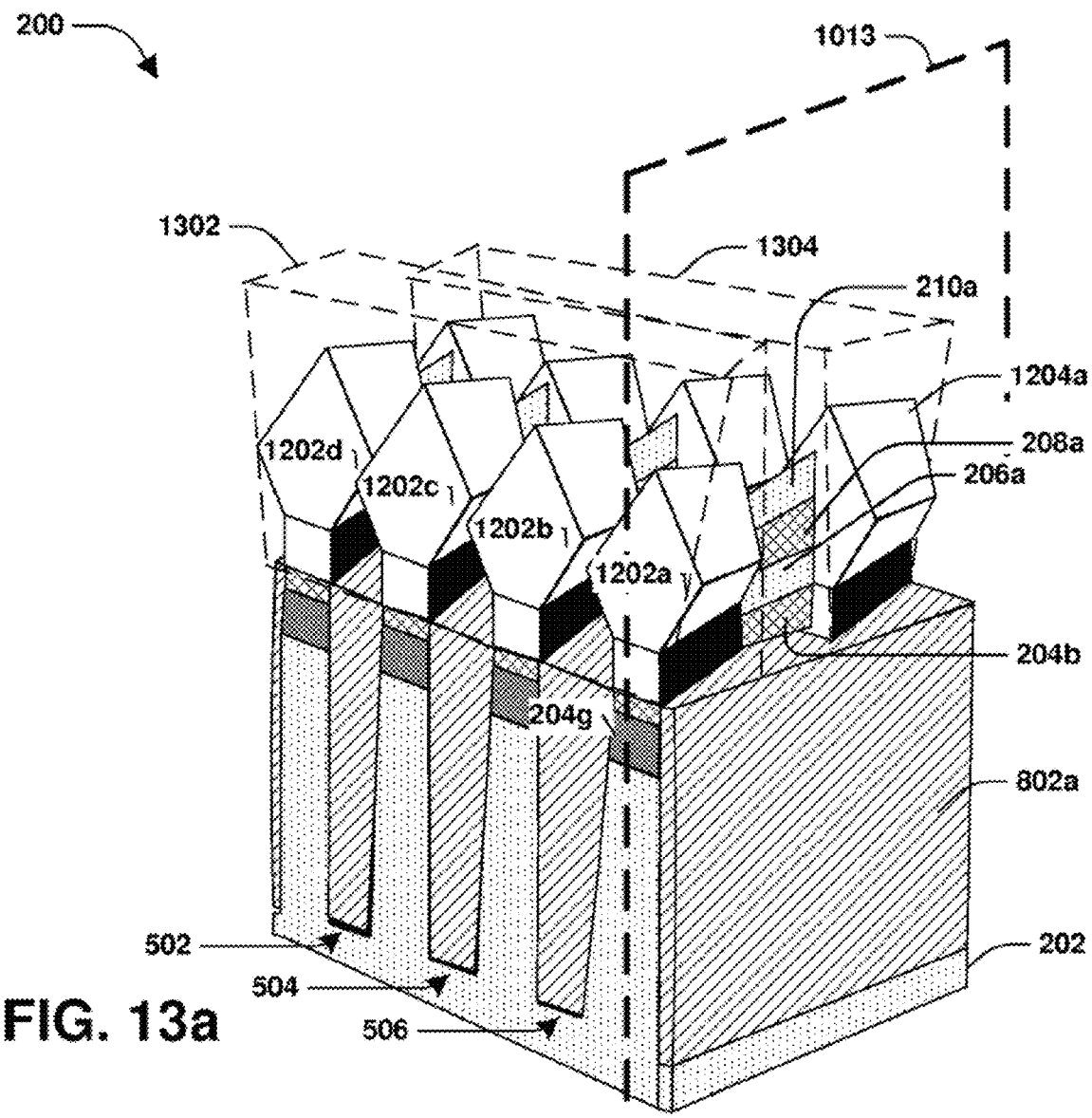
FIG. 13a is an illustration of removing a dummy poly structure from a semiconductor arrangement, in accordance with some embodiments.
FIG. 13b is a cross sectional view of a portion of a semiconductor arrangement, in accordance with some embodiments.

FIG. 13a illustrates removing the dummy poly structure 1002, and FIG. 13b illustrates a cross sectional view of a portion of the semiconductor arrangement 200 taken at a plane 1013. In some embodiments, a first oxide structure 1302 is formed on a first side of the dummy poly structure 1002 and a second oxide structure 1304 is formed on a second side of the dummy poly structure 1002. In some embodiments, CMP is performed and the dummy poly structure 1002 is removed, such as by a dry etching process, from between the first oxide structure 1302 and the second oxide structure 1304. In some embodiments, the second liner 1006 is not removed, and thus defines a gate region within which a gate, illustrated in FIGS. 16a and 16b, will be formed.

Figure 14A:
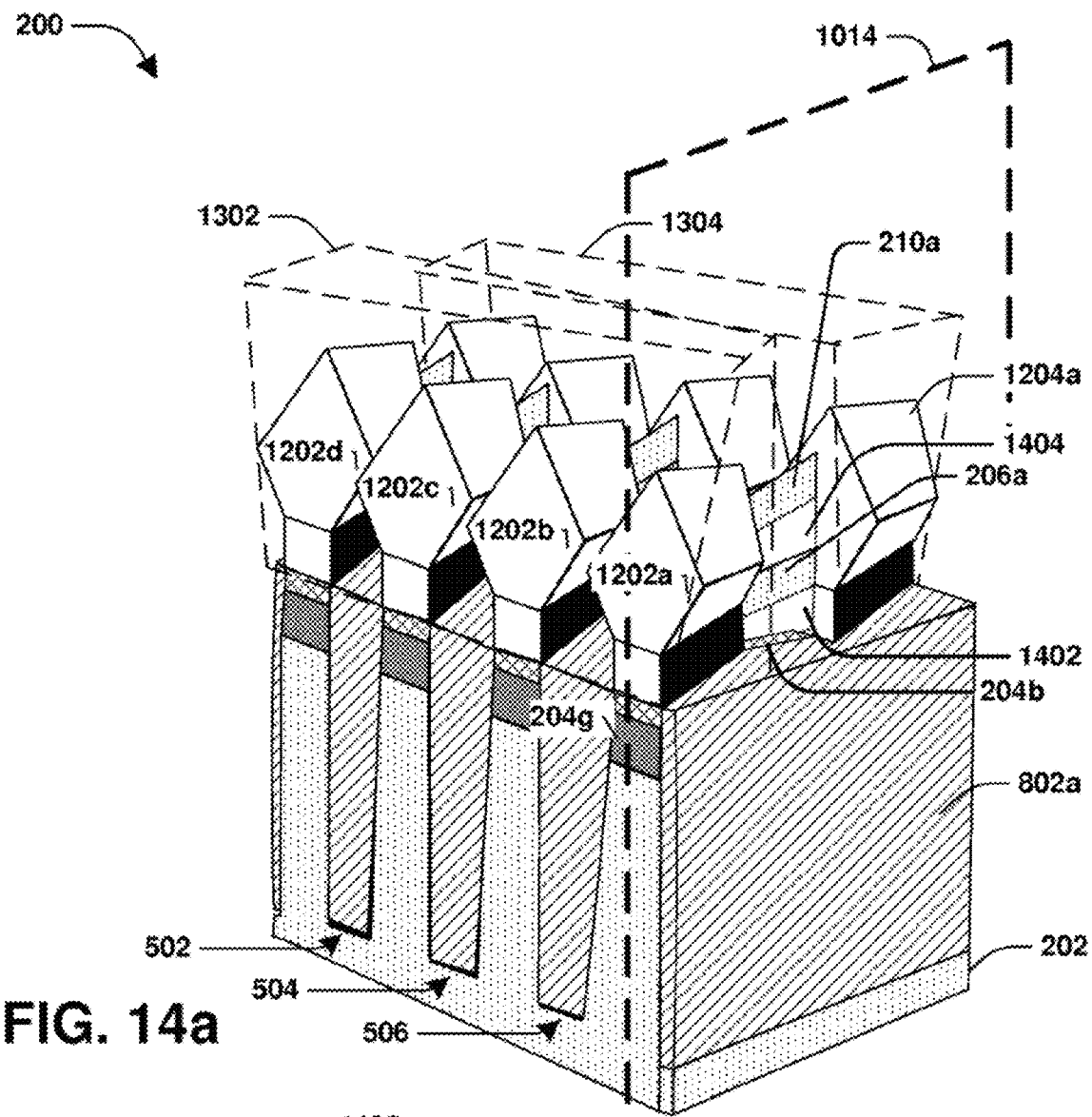
FIG. 14a is an illustration of a silicon germanium removal process for a semiconductor arrangement, in accordance with some embodiments.
Figure 14B:
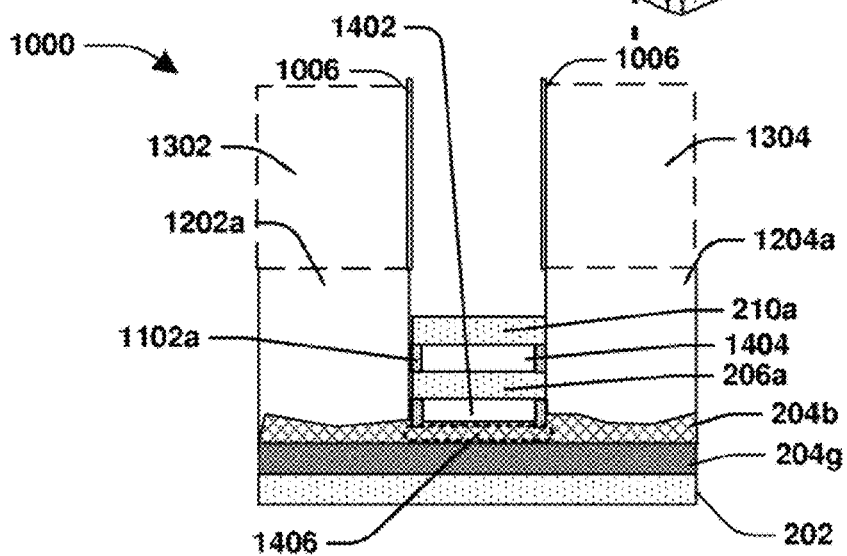
FIG. 14b is a cross sectional view of a portion of a semiconductor arrangement, in accordance with some embodiments.

FIG. 14a illustrates a silicon germanium removal process that removes the second silicon germanium layer portion 208a and a second portion 1306 of the first silicon germanium layer portion 204b, illustrated in FIG. 13b, resulting in a first gate region 1402 and a second gate region 1404 within which a gate is to be formed, and FIG. 14b illustrates a cross sectional view of a portion of the semiconductor arrangement 200 taken at a plane 1014. In some embodiments, a wet etch is performed as the silicon germanium removal process. In some embodiments, a third portion 1406 of the first silicon germanium layer portion 204b remains between the first gate region 1402 and the first isolation structure 204g.

Figure 15A:
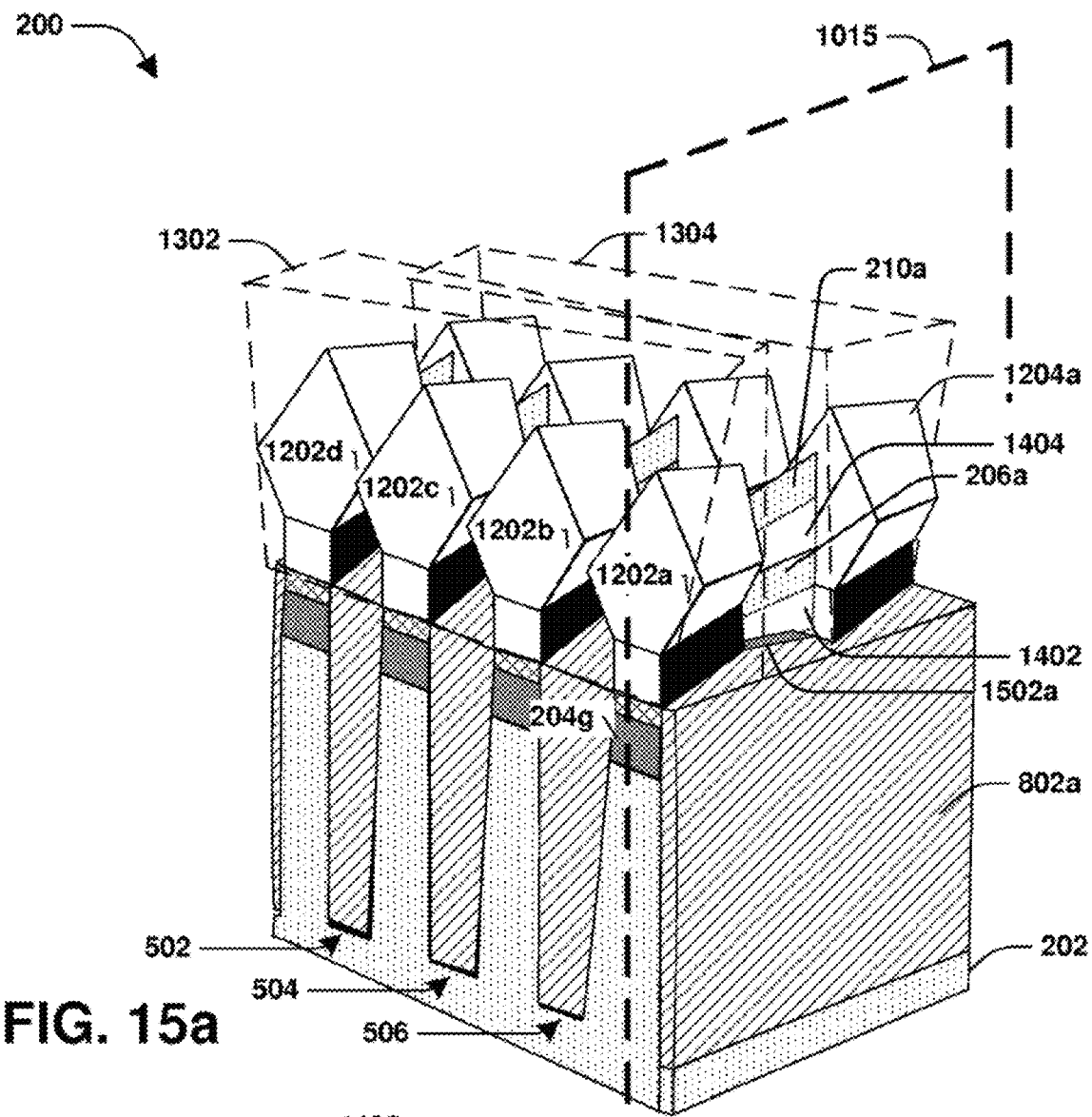
FIG. 15a is an illustration of forming a second isolation structure for a semiconductor arrangement, in accordance with some embodiments.
Figure 15B:
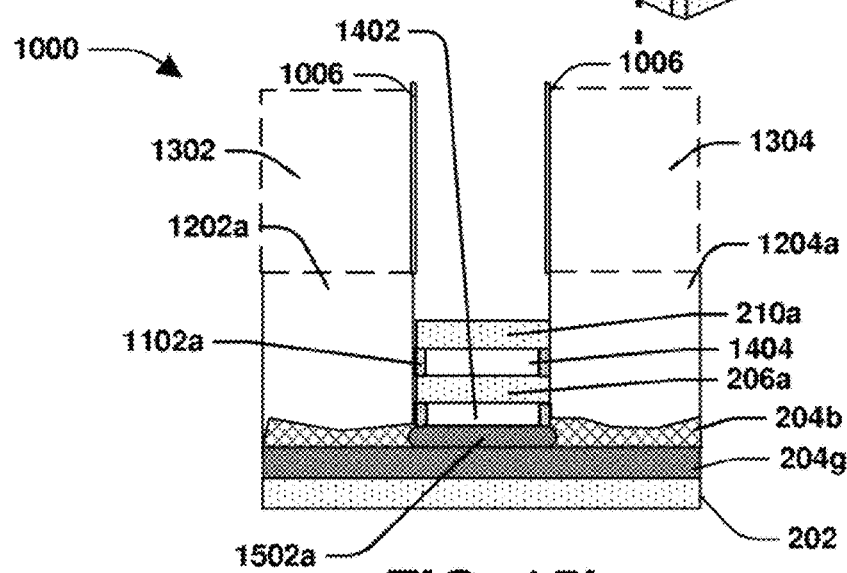
FIG. 15b is a cross sectional view of a portion of a semiconductor arrangement, in accordance with some embodiments.

FIG. 15a illustrates forming a second isolation structure 1502a within the third portion 1406 of the first silicon germanium layer portion 204b, and FIG. 15b illustrates a cross sectional view of the semiconductor arrangement 200 taken at a plane 1015. In some embodiments, the third portion 1406 of the first silicon germanium layer portion 204b, illustrated in FIG. 14b, is oxidized to create a silicon germanium oxide isolation layer as the second isolation structure 1502a. In some embodiments, the second isolation structure 1502a provides isolation between the first channel 206a and the substrate 202, which inhibits bottom current leakage into the substrate 202. In some embodiments, the second isolation structure 1502a provides isolation between the second channel 210a and the substrate 202, which inhibits bottom current leakage into the substrate 202. In some embodiments, the second isolation structure 1502a provides isolation between a gate, which is to be formed within the first gate region 1402, and the substrate 202. In some embodiments, the second isolation structure 1502a does not extend under the full length of the first source 1202a or the first drain 1204a.

FIG. 16a illustrates forming a gate comprising a first gate portion 1606, a second gate portion 1604, and a third gate portion 1602, and FIG. 16b illustrates a cross sectional view of the semiconductor arrangement 200 taken at a plane 1016. In some embodiments, at least some of the second gate portion 1604 and the third gate portion 1602 form a first gate, such as a gate-all-around structure gate, that wraps around one or more sides of the first channel 206a. In some embodiments, the first gate portion 1606 and at least some of the second gate portion 1604 form a second gate, such as a gate-all-around structure gate, that wraps around one or more sides of the second channel 210a.

FIG. 16b illustrates the semiconductor arrangement 200 comprising a first transistor arrangement and a second transistor arrangement. In some embodiments, the first transistor arrangement comprises the first channel 206a, the first gate comprising the third gate portion 1602 and a lower region of the second gate portion 1604, the first source 1202a, and the first drain 1204a. In some embodiments, the second transistor arrangement comprises the second channel 210a, the second gate comprising the first gate portion 1606 and an upper region of the second gate portion 1604, the first source 1202a, and the first drain 1204a. The first isolation structure 204g provides isolation between the first transistor arrangement and the substrate 202 and between the second transistor arrangement and the substrate 202. The second isolation structure 1502a provides isolation between the first transistor arrangement and the substrate 202 and between the second transistor arrangement and the substrate 202.

Figure 17:
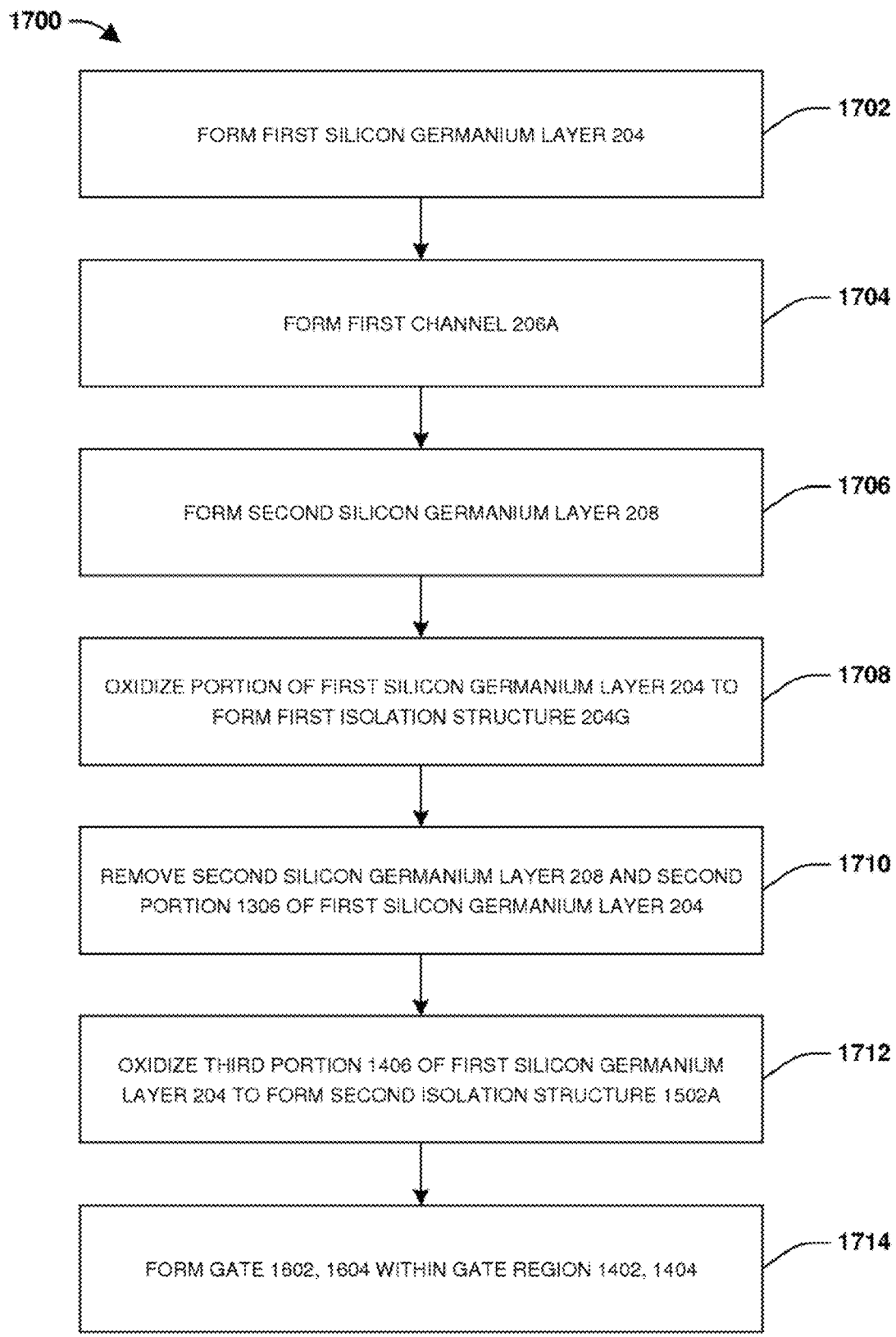
FIG. 17 is a flow diagram illustrating a method of forming a semiconductor arrangement, in accordance with some embodiments.

A method 1700 of forming the semiconductor arrangement 200 is illustrated in FIG. 17. At 1702, the first silicon germanium layer 204 is formed over the substrate 202. At 1704, the first channel 206a, such as an un-doped channel, is formed over the first silicon germanium layer 204. At 1706, the second silicon germanium layer 208 is formed over the first channel 206a. At 1708, a portion of the first silicon germanium layer 204, such as the first silicon germanium structure 204c, is oxidized to form the first isolation structure 204g. At 1710, the second silicon germanium layer 208 and a second portion 1306 of the first silicon germanium layer 204 are removed to define a gate region, such as the first gate region 1402 and the second gate region 1404, around the first channel 206a. At 1712, a third portion 1406 of the first silicon germanium layer 204 is oxidized to form a second isolation structure 1502a. At 1714, a gate, such as the second gate portion 1604 and the third gate portion 1602, is formed within the gate region.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

According to some embodiments, a semiconductor arrangement is provided. According to some embodiments, the semiconductor arrangement comprises a channel over a substrate. According to some embodiments, the semiconductor arrangement comprises a gate around the channel. According to some embodiments, the semiconductor arrangement comprises an isolation structure between the gate and the substrate.

According to some embodiments, a semiconductor arrangement is provided. According to some embodiments, the semiconductor arrangement comprises a channel over a substrate. According to some embodiments, the semiconductor arrangement comprises a gate around the channel. According to some embodiments, the semiconductor arrangement comprises a second channel over the channel. According to some embodiments, the semiconductor arrangement comprises a second gate around the second channel. According to some embodiments, the semiconductor arrangement comprises an isolation structure between the gate and the substrate and between the second gate and the substrate.

According to some embodiments, a method for forming a semiconductor arrangement is provided. According to some embodiments, the method comprises forming a first silicon germanium layer over a substrate. According to some embodiments, a first channel is formed over the first silicon germanium layer. According to some embodiments, a second silicon germanium layer is formed over the first channel. According to some embodiments, a portion of the first silicon germanium layer is oxidized to form a first isolation structure. According to some embodiments, the second silicon germanium layer and a second portion of the first silicon germanium layer are removed to define a gate region around the first channel. According to some embodiments, a third portion of the first silicon germanium layer is oxidized to form a second isolation structure. According to some embodiments, a gate is formed within the gate region.

What is claimed is:

1. A semiconductor arrangement, comprising:
   a channel over a substrate;
   a gate around the channel;
   a source and a drain comprising a first semiconductor material, wherein the channel interposes the source and the drain;
   a first isolation structure between the gate and the substrate, wherein the first isolation structure extends under the source and the drain and a second isolation structure disposed over the first isolation structure and between the gate and the substrate, wherein the first isolation structure has a first top surface a first distance from a top surface of the substrate and the second isolation structure has a second top surface a second distance from the top surface of the substrate, the second distance greater than the first distance; and
   a portion of a second semiconductor material disposed over the first isolation structure and adjacent to and abutting a sidewall of the second isolation structure.

2. The semiconductor arrangement of claim 1, the first isolation structure and the second isolation structure comprising silicon germanium oxide.

3. The semiconductor arrangement of claim 1, the channel comprising an un-doped channel.

4. The semiconductor arrangement of claim 1, the portion of the second semiconductor material is a silicon germanium layer.

5. The semiconductor arrangement of claim 1, wherein the first isolation structure directly interfaces the second isolation structure.

6. The semiconductor arrangement of claim 1, the gate comprising a gate-all-around structure.

7. The semiconductor arrangement of claim 1, comprising:
   a second channel over the channel and a portion of the gate around the second channel.

8. The semiconductor arrangement of claim 1, wherein the portion of the second semiconductor material extends a length of the sidewall of the second isolation structure.

9. The semiconductor arrangement of claim 1, wherein the gate directly interfaces the second isolation structure between the channel and the substrate.

10. The semiconductor arrangement of claim 1, the gate comprising a gate-all-around structure.

11. The semiconductor arrangement of claim 1, the channel comprising silicon wire and wherein the second isolation structure is an oxide of the second semiconductor material.

12. A semiconductor arrangement, comprising:
    a channel over a substrate;
    a gate around the channel;
    a second channel over the channel;
    a second gate around the second channel; and
    an isolation structure between the gate and the substrate and between the second gate and the substrate, wherein the isolation structure has a first thickness under the gate and wherein the isolation structure has a second thickness under a source region adjacent the channel and the gate, wherein the isolation structure comprises silicon germanium oxide.

13. The semiconductor arrangement of claim 12, at least one of the channel or the second channel comprising an un-doped channel.

14. The semiconductor arrangement of claim 12, further comprising:
    a first spacer abutting sidewalls of the gate; and
    a second spacer abutting sidewalls of the second gate.

15. The semiconductor arrangement of claim 14, wherein the first spacer interfaces the isolation structure.

16. The semiconductor arrangement of claim 12, wherein a silicon germanium layer is disposed over a top surface of the isolation structure having the second thickness, wherein the silicon germanium layer extends from the top surface to be level with the isolation structure of having the first thickness.

17. The semiconductor arrangement of claim 12, wherein the second thickness is less than the first thickness.

18. A semiconductor device, comprising:
    a semiconductor substrate having a plurality of fins extending from a top surface, wherein the plurality of fins are interposed by dielectric trenches;
    a first isolation structure disposed on an upper portion of a first fin of the plurality of fins, wherein a sidewall of the first isolation structure interfaces a first dielectric trench of the dielectric trenches;
    a semiconductor region extends from the first isolation structure to a source/drain feature; and a second isolation structure over the first isolation structure and abutting a sidewall of the semiconductor region and being disposed under a gate, wherein the gate has a first gate portion and a second gate portion, a channel region interposing the first gate portion and the second gate portion.

19. The semiconductor device of claim 18, wherein a top surface of the semiconductor region is level with a top surface of the first dielectric trench.

20. The semiconductor device of claim 18, wherein the first isolation structure and the second isolation structure are silicon germanium oxide.

* * * * *